United States Patent [19]

Jaffe et al.

[11] 4,396,140

[45] Aug. 2, 1983

[54] METHOD OF BONDING ELECTRONIC COMPONENTS

[75] Inventors: Donald Jaffe, Emmaus; Richard C. Kershner, Whitehall; Nicholas T. Panousis, Wescosville, all of Pa.

[73] Assignee: Bell Telephone Laboratories, Incorporated, Murray Hill, N.J.

[21] Appl. No.: 228,954

[22] Filed: Jan. 27, 1981

[51] Int. Cl.³ .......................... B23K 1/20; H01L 21/60
[52] U.S. Cl. .............................. 228/123; 228/180 A; 228/253; 228/254
[58] Field of Search .................... 228/180 A, 253, 254, 228/123, 124

[56] References Cited

U.S. PATENT DOCUMENTS 3,516,155 6/1970 Smith .......................... 228/180 A X
4,332,341 6/1982 Minetti ............................ 228/180 A

FOREIGN PATENT DOCUMENTS 2728330 1/1979 Fed. Rep. of Germany ... 228/180 A
2025804 1/1980 United Kingdom .......... 228/180 A

OTHER PUBLICATIONS

*IBM Technical Disclosure Bulletin*, article entitle, "Tinning Preplated Sites on a Substrate", vol. 19, No. 8, p. 3049, (1977).

*Primary Examiner*—Kenneth J. Ramsey
*Attorney, Agent, or Firm*—Lester H. Birnbaum

[57] ABSTRACT

Disclosed is a method of bonding electronic components (14) to metallized substrates (21) by soldering. The solder is first deposited on an unmetallized substrate (10) in a pattern of discrete pads (11, 12, 13) corresponding to the leads (28, 29, 30) of the components to be bonded. The component leads are then placed on the pads and the solder is reflowed. The solder thereby adheres to the leads so that a controlled amount of solder will remain on each lead when the component is lifted from the substrate. The components can then be soldered to an appropriate metallized substrate.

9 Claims, 6 Drawing Figures

METHOD OF BONDING ELECTRONIC COMPONENTS

BACKGROUND OF THE INVENTION

This invention relates to solder bonding of electronic components to metallized substrates, and in particular to a method of getting a controlled amount of solder at each bonding site.

In circuit fabrication, the bonding of components to a metallized substrate is often critically important. For example, in the manufacture of many types of hybrid integrated circuits, components such as soldered-on transistors, discrete chip capacitors, and ceramic chip carriers are soldered to ceramic substrates containing thick film metallization. Typically, this is accomplished by applying a solder paste to bonding pads on the substrate, bringing the component leads into contact with the solder pads, and then heating to reflow the solder and establish the bond. This procedure, although adequate, often resulted in electrical shorting due to the fact that solder particles tend to be ejected from the paste during the reflow step and migrate to other portions of the substrate.

Alternative procedures also involve some significant drawbacks. For example, the solder may be applied by dipping the component into a molten solder bath, followed by applying the leads of the component to the bonding pads and reflowing the solder. In this procedure, it is often difficult to apply a sufficient amount of solder to the leads. Another method is to apply solder preforms to each bonding pad on the substrate prior to applying the leads to the pads. This method allows placement of a sufficient amount of solder at each bonding site and avoids ejection of the solder during reflow since there is no agitation of an organic carrier as when a paste is used. However, this method would require extensive machine design and re-tooling to be practical for manufacturing a wide range of circuits.

It is therefore a primary object of the invention to provide an economical means of soldering electronic components to a metallized substrate which places a precise amount of solder at each bonding site and avoids problems of solder migration over the substrate.

SUMMARY OF THE INVENTION

This and other objects are achieved in accordance with the invention which in one aspect is a method for bonding an electronic component to bonding pads on a metallized substrate. The method includes the steps of applying solder to the leads of the component, bringing the leads into contact with corresponding bonding pads on the metallized substrate, and heating the structure to melt the solder and establish a bond between the leads and the bonding pads. The solder is applied to the leads by first depositing solder on an unmetallized substrate in a pattern of discrete pads corresponding to the leads of the component. The component leads are brought into contact with the solder pads on the substrate, and the structure is heated to reflow the solder and cause the solder to adhere to each lead. When the component is removed from the substrate, solder is therefore present on each lead so the component can be bonded to the metallized substrate. In accordance with another aspect, the invention is a method of applying a precise amount of solder to the leads of a component as previously described so the component can later be bonded to a metallized substrate.

BRIEF DESCRIPTION OF THE DRAWING

These and other features of the invention are delineated in detail in the following description. In the drawing.

It should be appreciated that for purposes of illustration, these figures are not necessarily drawn to scale.

DETAILED DESCRIPTION

Figure 1:
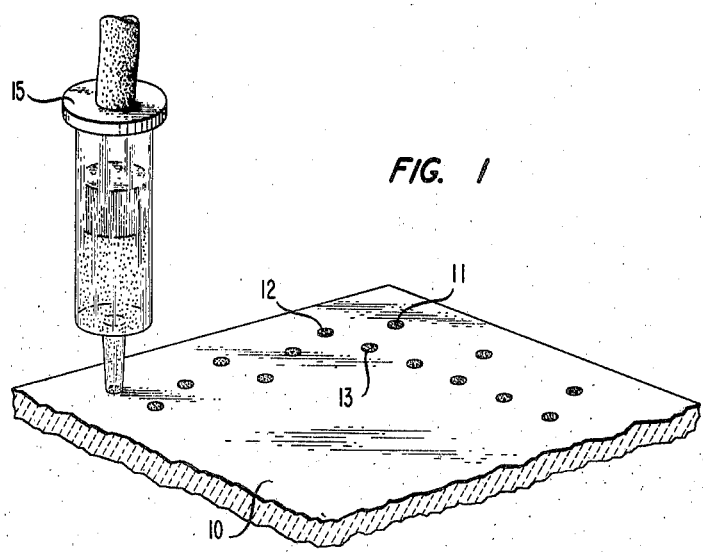
FIGS. 1–4 are perspective views of elements involved in the practice of the invention during various stages of fabrication in accordance with one embodiment.
Figure 2:
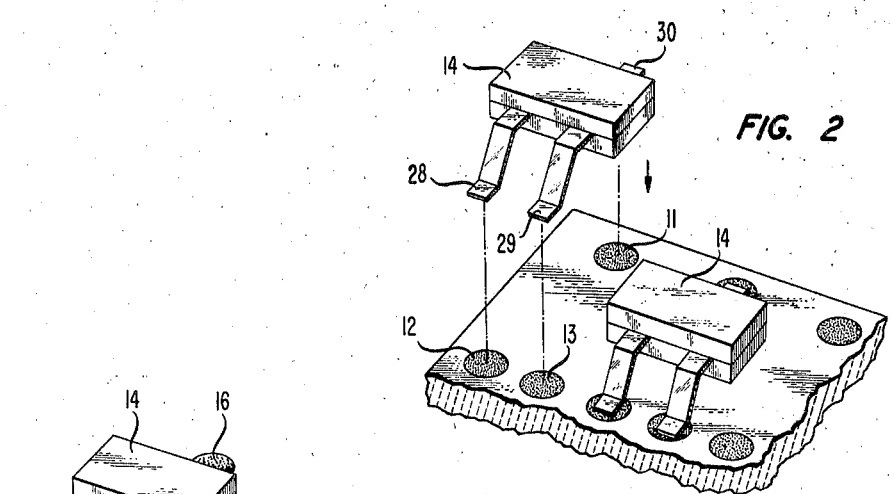

One embodiment of the invention will be described with reference to the sequence of steps illustrated in FIGS. 1–4. FIG. 1 shows an unmetallized substrate, 10, which in this case comprises ceramic but can be any substrate to which solder does not adhere. In this particular example, the substrate was alumina and measured approximately $3\frac{3}{4}$ inches $\times 4\frac{1}{2}$ inches. Formed on the substrate was a repetitive pattern of discrete pads of solder, 11, 12 and 13. Each pattern corresponds to the lead configuration of the component which is to be bonded. In this case, as shown in FIG. 2, the component, 14, was a three-leaded configuration known in the art as a soldered-on transistor. Such components generally include a single silicon chip wire bonded to the external leads 28, 29 and 30 and encapsulated in an epoxy. The leads are fabricated from a suitable metal, in this case an iron-nickel-cobalt alloy with a gold flash followed by tin plating. It will be appreciated, that the invention can be used to solder any electronic component by merely changing the solder pattern on the unmetallized substrate.

The particular solder used in this example was a paste comprising solder of approximately 60 percent by weight tin and 40 percent by weight lead and a flux where the solder comprised approximately 88 percent of the paste. The paste is sold by DuPont under the designation Formon 8522. Other solder compositions and other manufacturers of paste can be employed. The composition of the flux does not appear to be significant. The solder pads were dispensed by a manual pneumatic dispensing apparatus which is sold by Assembly Systems, Inc. under the designation Model 727V Dispenser. The applicator, 15, of said apparatus is shown in FIG. 1. Typically, a 20 gauge dispensing tip with a 24 mil inner diameter was employed. A dwell time of 1.5 seconds and a pressure of 40 psig were used. For the particular solder used, having a paste viscosity of 45,000 cps, each pad typically comprised an average of approximately 1.5 mg of solder. In order to provide sufficient solder to each lead, it is recommended that, for this particular example, each pad comprise at least 1 mg of solder.

Each pad was approximately 60 mils in diameter with a center-to-center distance from its nearest neighbor of approximately 200 mils. Although only a few patterns are shown in FIG. 1, it will be appreciated that the pattern can be placed in a two-dimensional array so that approximately three hundred 3-pad patterns can be formed on a substrate of this size. It will also be realized that other methods of depositing the solder pads can be employed, such as an automatic dispensing operation or screen printing.

After deposition of the solder paste pads, 11, 12, and 13, on the unmetallized substrate, the components, 14, were placed on the substrate so that each lead was in physical contact with one of the pads in the pattern. This is illustrated with two components in FIG. 2. These particular components had leads approximately 4 mils thick and 17 mils wide. Any solderable metal lead could be used with the present invention.

After all components were in place on the substrate, the solder was reflowed so that the solder wetted the component leads but not the unmetallized substrate. In this example, the substrate was heated in a commercially available linear reflow furnace so that the temperature was increased linearly from 25 to approximately 220 degrees Celsius in approximately 25 seconds. The time the solder was above its melting point (186 degrees Celsius) was approximately 30 seconds. Of course, temperature and time will depend on the particular solder employed. In general, peak temperatures in the range 190 to 250 degrees Celsius will be used and the time the solder is above its melting point will be in the range 15–60 seconds.

After reflowing, the components remained in place on the unmetallized substrate due to the adhesive action of the flux from the solder paste. The flux was therefore removed in the next step. This was accomplished in this example by immersing the substrate in a solution comprising a blend of perchloroethylene and polar solvents, which is sold by Alpha Metals under the designation Reliasolve ® 564, for approximately 5 minutes. Other standard flux removers could be used. Next the substrate was immersed in a solution comprising trichlorotrifluoroethane and acetone, generally known in the trade as Freon TA ® sold by DuPont in order to remove any traces of the flux remover. Other methods of flux removal might be employed, for example, vapor-liquid cleaning using a trichlorotrifluoroethane and methylene chloride solution such as Freon TMC ® sold by DuPont.

Figure 3:
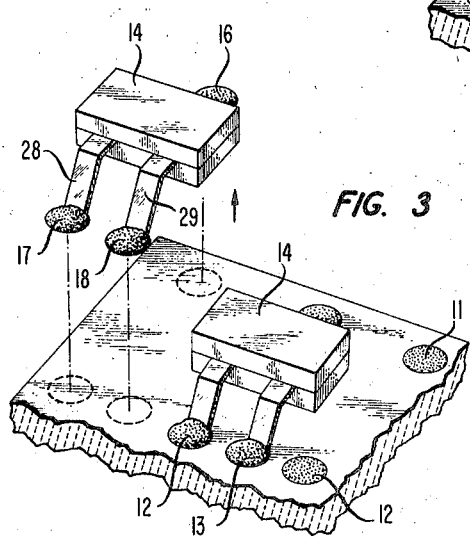
Figure 5:
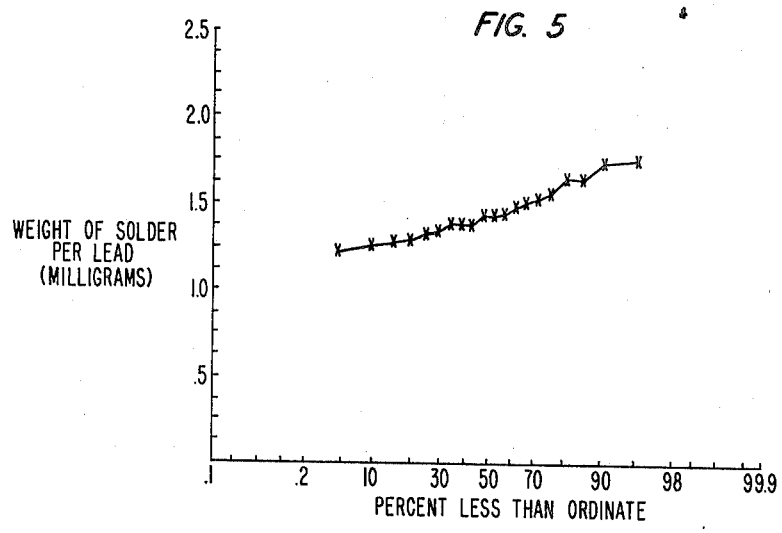
FIG. 5 is a graph of weight distribution of solder per component lead achieved in accordance with the same embodiment.

When the components were then removed from the substrate, as illustrated in FIG. 3, each lead had adhering thereto essentially all of the solder 16, 17 and 18 of the corresponding pad (11, 12 and 13) from the unmetallized substrate. In order to test uniformity of solder application to each lead, substrates were treated as described above but without the components being applied. After flux removal, the individual solder pads were removed from the substrate and weighed. Typical results are shown in the graph of FIG. 5. The mean weight of the solder pads was 1.5 mg per pad, and individual weights ranged from 1.3 to 1.7 mg, thus demonstrating that an appropriate amount of solder would be applied to each lead. It will be realized that an amount of solder outside this range could be applied with an appropriate variation in the amount of solder applied to the substrate. For this particular component, at least 1 mg of solder per lead is desirable. It should also be noted that the amount of solder applied to each lead by the present process was approximately 10 times the amount which could be applied by solder dipping.

Figure 4:
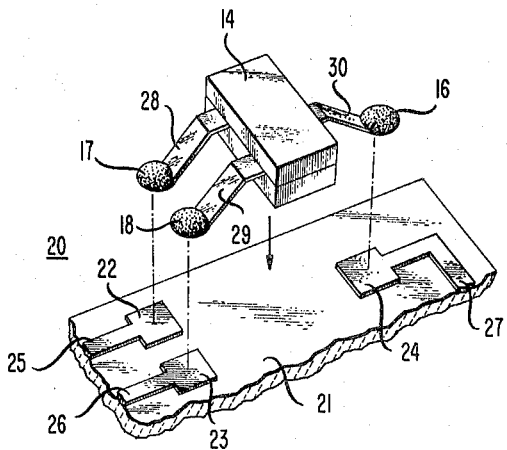

Next, as shown in FIG. 4, the components were bonded to appropriate bonding sites on a thick film circuit, 20, formed on a ceramic substrate 21, only a portion of which is illustrated. The bonding site included three bonding pads, 22, 23 and 24, corresponding to the three leads of the component and conductors 25, 26, 27 coupling the pads to other portions of the circuit. In this example, the bonding pads and conductors comprised a mixture of platinum, palladium and silver with a thickness of 0.7–0.8 mils. The area of each pad was approximately 1200 square mils. In accordance with standard solder bonding, after applying a standard flux to the bonding pads the leads with the solder attached were placed in contact with the appropriate bonding pads and the structure was heated to melt the solder and establish the bond. In this example, the same heating cycle was employed as that used for the original reflow on the unmetallized substrate, though this is not necessary. Again, peak temperatures of 190–250 degrees C. and times above the melting point in the range 15–60 seconds will generally be used.

One of the advantages of the present method is the fact that when the component is bonded to the thick film substrate, there is essentially no ejection of solder particles to other portions of the circuit as was often the case when solder paste was applied directly to the substrate. This effect does not occur here since the particles had previously been ejected during reflow while the solder was on the unmetallized substrate. Any ejected particles in the present invention, therefore, do no damage since they occur on an unmetallized substrate. The unmetallized substrate can be re-used any number of times by cleaning off any excess solder and/or flux subsequent to removal of the components. This can be accomplished by any standard cleaning operation, such as vapor degreasing using Freon TMC ®.

Figure 6:
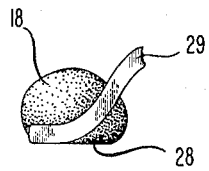
FIG. 6 is an enlarged cross-sectional view of a portion of a component lead with solder applied thereto in accordance with the same embodiment.

A further advantage of the invention can be seen from FIG. 6 which is a cross-sectional view of a typical lead with solder applied thereto after removal of the component from the unmetallized substrate. It will be noted that the solder mass, 18, forms an essentially flat bottom surface, 28. This means that the component will more easily remain in place on the bonding pads of the circuit during the reflow operation. By comparison, solder dipping tended to produce a rounded bottom surface.

Components bonded in accordance with the above process were 90 degree pull tested. No failures occurred in the leads or the solder connections. Rather, failures occurred as fractures of the epoxy package. The mean pull strength was 5.7 pounds per component, with strengths ranging from 5.1 to 6.5 pounds per component. These strengths are comparable to those obtained with prior art soldering procedures such as use of solder preforms.

In addition to bonding soldered-on transistors, the invention is useful for bonding other components such as ceramic chip capacitors, ceramic chip carriers, dual-in-line packages, and molded plastic encapsulated integrated circuit packages (also known as the "miniquad"). The components to be bonded may include beam leads, foil leads, bonding pads, or any other type of conductor which can be solder bonded. The circuit to which the component is bonded need not be a thick film circuit as in this example. Rather, the circuit could be a thin film circuit or a printed wiring board.

Various additional modifications will become apparent to those skilled in the art. All such variations which basically rely on the teachings through which the invention has advanced the art are properly considered within the spirit and scope of the invention.

What is claimed is:

1. A method of applying solder (16, 17, 18) to the leads (28, 29, 30) of an electronic component (14) characterized in the steps of first depositing solder in the form of a paste comprising lead, tin, and a flux on an unmetallized substrate (10) in a pattern of discrete pads (11, 12, 13) corresponding to the leads of the component, bringing the leads into contact with the solder pads on the substrate, heating the structure to reflow the solder and cause the solder to adhere to each lead, removing the flux from the solder to permit removal of the component from the substrate, and removing the component from the substrate.

2. A method for bonding an electronic component (14) to bonding pads (22, 23, 24) on a metallized substrate (21) comprising the steps of applying solder (16, 17, 18) to the leads (28, 29, 30) of the component, bringing said leads into contact with corresponding bonding pads on said metallized substrate, and heating the structure to melt the solder and establish a bond between the leads and bonding pads characterized in that the solder is applied to the leads by first depositing solder in the form of a paste comprising lead, tin and a flux on an unmetallized substrate (10) in a pattern of discrete pads (11, 12, 13) corresponding to the leads of the component, bringing the leads into contact with the solder pads on the substrate, heating the structure to reflow the solder and cause the solder to adhere to each lead, removing the flux from the solder to permit removal of the component from the unmetallized substrate, and removing the component from the substrate.

3. The method according to claim 2 wherein the unmetallized substrate comprises ceramic.

4. The method according to claim 2 wherein the solder on the unmetallized substrate is reflowed by heating at a peak temperature in the range 190–250 degrees Celsius for a period of 15–60 seconds.

5. The method according to claim 2 wherein the amount of solder adhering to each lead when the component is removed from the unmetallized substrate is at least 1 mg.

6. The method according to claim 2 wherein the metallized substrate comprises ceramic with a thick film circuit (20) formed thereon.

7. The method according to claim 2 wherein the component is a soldered-on transistor.

8. The method according to claim 2 wherein the solder adhering to each lead (e.g., 18 of FIG. 6) has a flat bottom surface (28).

9. A method for bonding an electronic component (14) to bonding pads (22, 23, 24) on a metallized substrate (21) comprising the steps of applying solder (16, 17, 18) to the leads (28, 29, 30) of the component, bringing said leads into contact with corresponding bonding pads on said metallized substrate, and heating the structure to melt the solder and establish a bond between the leads and bonding pads characterized in that the solder is applied to the leads by first depositing on an unmetallized substrate (10) a solder paste comprising lead, tin and a flux in a pattern of discrete pads (11, 12, 13) corresponding to the leads of the component, bringing the leads into contact with the solder pads on the substrate, heating the structure at a peak temperature in the range 190–250 degrees Celsius to melt the solder for a period of 15–60 seconds and cause the solder to adhere to each lead while the component remains in place on the unmetallized substrate, removing the flux from the solder, and removing the component from the substrate.

* * * * *